United States Patent
Lee et al.

(10) Patent No.: US 11,646,179 B2
(45) Date of Patent: May 9, 2023

(54) PLASMA PROCESSING APPARATUS AND PLASMA PROCESSING METHOD

(71) Applicant: Samsung Electronics Co., Ltd., Suwon-si (KR)

(72) Inventors: Jang-Yeob Lee, Hwaseong-si (KR); Sungyeol Kim, Yongin-si (KR); Jinyeong Yun, Yongin-si (KR); Minsung Kim, Seoul (KR); HoSun Yoo, Seongnam-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/335,659

(22) Filed: Jun. 1, 2021

(65) Prior Publication Data

US 2022/0093369 A1    Mar. 24, 2022

(30) Foreign Application Priority Data

Sep. 24, 2020   (KR) .................. 10-2020-0123970

(51) Int. Cl.
*H01J 37/32*    (2006.01)

(52) U.S. Cl.
CPC .. *H01J 37/32642* (2013.01); *H01J 37/32541* (2013.01); *H01J 37/32568* (2013.01); *H01J 37/32715* (2013.01)

(58) Field of Classification Search
CPC ........... H01J 37/32642; H01J 37/32541; H01J 37/32568; H01J 37/32715
See application file for complete search history.

(56) References Cited

U.S. PATENT DOCUMENTS

| | | |
|---|---|---|
| 5,187,454 A | 2/1993 | Collins et al. |
| 5,223,457 A | 6/1993 | Mintz et al. |
| 5,300,460 A | 4/1994 | Collins et al. |
| 5,312,778 A | 5/1994 | Collins et al. |
| 5,349,313 A | 9/1994 | Collins et al. |
| 5,392,018 A | 2/1995 | Collins et al. |
| 5,423,945 A | 6/1995 | Marks et al. |
| 5,428,506 A | 6/1995 | Brown et al. |
| 5,477,975 A | 12/1995 | Rice et al. |

(Continued)

FOREIGN PATENT DOCUMENTS

| | | |
|---|---|---|
| JP | 1999097430 | 4/1999 |
| KR | 101118003 B1 | 2/2012 |

(Continued)

*Primary Examiner* — Henry Luong
(74) *Attorney, Agent, or Firm* — Myers Bigel, P.A.

(57) ABSTRACT

A plasma processing apparatus includes a chamber providing a space for processing a substrate, a substrate stage configured to support the substrate within the chamber and including a lower electrode, an upper electrode facing the lower electrode, a focus ring in or on an upper peripheral region of the substrate stage to surround the substrate, and a plasma adjustment assembly in at least one of a first position between the upper electrode and the lower electrode and a second position between the focus ring and the lower electrode, the plasma adjustment assembly including a photoreactive material layer and a plurality of light sources configured to irradiate light onto a local region of the photoreactive material layer. A capacitance of the local region is changed as the light is irradiated to the local region.

20 Claims, 13 Drawing Sheets

(56) References Cited

U.S. PATENT DOCUMENTS

| | | |
|---|---|---|
| 5,556,501 A | 9/1996 | Collins et al. |
| 5,572,170 A | 11/1996 | Collins et al. |
| 5,574,410 A | 11/1996 | Collins et al. |
| 5,618,382 A | 4/1997 | Mintz et al. |
| 5,707,486 A | 1/1998 | Collins |
| 5,770,099 A | 6/1998 | Rice et al. |
| 5,772,832 A | 6/1998 | Collins et al. |
| 5,849,136 A | 12/1998 | Mintz et al. |
| 5,880,037 A | 3/1999 | Arleo |
| 5,888,414 A | 3/1999 | Collins et al. |
| 5,990,017 A | 11/1999 | Collins et al. |
| 6,024,826 A | 2/2000 | Collins et al. |
| 6,036,877 A | 3/2000 | Collins et al. |
| 6,036,878 A | 3/2000 | Collins |
| 6,054,013 A | 4/2000 | Collins et al. |
| 6,063,233 A | 5/2000 | Collins et al. |
| 6,068,784 A | 5/2000 | Collins et al. |
| 6,074,512 A | 6/2000 | Collins et al. |
| 6,077,384 A | 6/2000 | Collins et al. |
| 6,083,412 A | 7/2000 | Rice et al. |
| 6,090,303 A | 7/2000 | Collins et al. |
| 6,095,083 A | 8/2000 | Rice et al. |
| 6,095,084 A | 8/2000 | Shamouilian et al. |
| 6,165,311 A | 12/2000 | Collins et al. |
| 6,171,974 B1 | 1/2001 | Marks et al. |
| 6,184,150 B1 | 2/2001 | Yang et al. |
| 6,194,325 B1 | 2/2001 | Yang et al. |
| 6,217,785 B1 | 4/2001 | Collins et al. |
| 6,218,312 B1 | 4/2001 | Collins et al. |
| 6,238,588 B1 | 5/2001 | Collins et al. |
| 6,251,792 B1 | 6/2001 | Collins et al. |
| 6,252,354 B1 | 6/2001 | Collins et al. |
| 6,361,644 B1 | 3/2002 | Collins |
| 6,365,063 B2 | 4/2002 | Collins et al. |
| 6,399,514 B1 | 6/2002 | Marks et al. |
| 6,440,221 B2 | 8/2002 | Shamouilian et al. |
| 6,440,866 B1 | 8/2002 | Collins et al. |
| 6,444,084 B1 | 9/2002 | Collins |
| 6,444,085 B1 | 9/2002 | Collins et al. |
| 6,444,137 B1 | 9/2002 | Collins et al. |
| 6,454,898 B1 | 9/2002 | Collins et al. |
| 6,488,807 B1 | 12/2002 | Collins et al. |
| 6,514,376 B1 | 2/2003 | Collins et al. |
| 6,518,195 B1 | 2/2003 | Collins et al. |
| 6,524,432 B1 | 2/2003 | Collins et al. |
| 6,545,420 B1 | 4/2003 | Collins et al. |
| 6,623,596 B1 | 9/2003 | Collins et al. |
| 6,736,931 B2 | 5/2004 | Collins et al. |
| 6,790,311 B2 | 9/2004 | Collins et al. |
| 6,818,140 B2 | 11/2004 | Ding |
| 6,824,621 B2 | 11/2004 | Shibagaki |
| 6,927,169 B2 | 8/2005 | Thakur et al. |
| 9,076,636 B2 | 7/2015 | Ohata et al. |
| 9,633,886 B2 | 4/2017 | Evans et al. |
| 10,128,144 B2 | 11/2018 | Behdjat et al. |
| 10,283,382 B2 | 5/2019 | Noh et al. |
| 2001/0054601 A1 | 12/2001 | Ding |
| 2002/0004309 A1 | 1/2002 | Collins et al. |
| 2004/0163764 A1 | 8/2004 | Collins et al. |
| 2014/0263177 A1* | 9/2014 | Povolny ............ C23C 16/4586 427/535 |
| 2019/0122860 A1* | 4/2019 | Lee ................. H01J 37/3233 |
| 2020/0176226 A1* | 6/2020 | Tsukahara ......... H01J 37/32642 |
| 2021/0110997 A1* | 4/2021 | Shin ................. H01L 21/3065 |

FOREIGN PATENT DOCUMENTS

| | | |
|---|---|---|
| KR | 101569904 B1 | 11/2015 |
| KR | 101754564 B1 | 7/2017 |

* cited by examiner

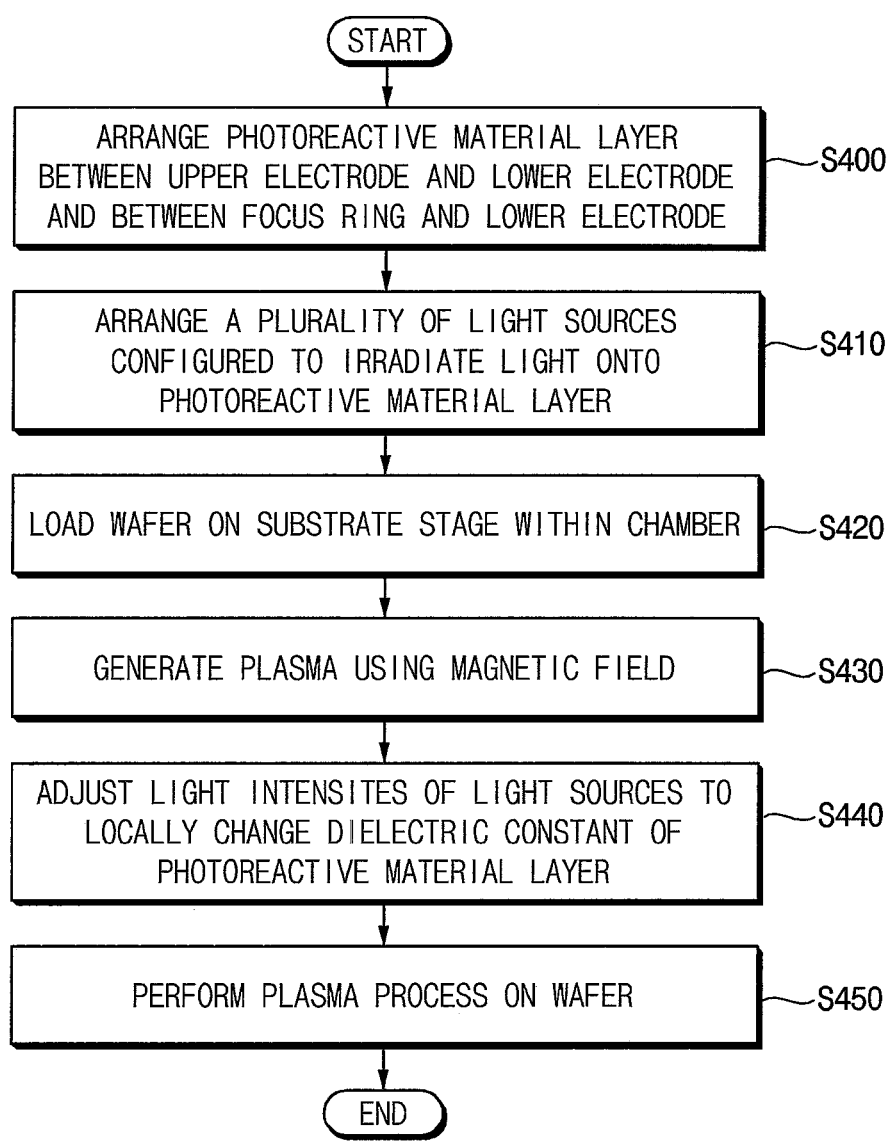

PLASMA PROCESSING APPARATUS AND PLASMA PROCESSING METHOD

PRIORITY STATEMENT

This application claims priority under 35 U.S.C. § 119 to Korean Patent Application No. 10-2020-0123970, filed on Sep. 24, 2020 in the Korean Intellectual Property Office, the contents of which are incorporated by reference herein in their entirety.

BACKGROUND

Example embodiments relate to a plasma processing apparatus and a plasma processing method. More particularly, example embodiments relate to a plasma processing apparatus configured to process a substrate within a plasma chamber and a plasma processing method using the same.

A plasma processing apparatus may generate plasma in a chamber to perform an etching process or a deposition process. However, the plasma formed inside the chamber may have asymmetry, and in a related art for controlling such plasma asymmetry, a radiation symmetrical control method or a method of controlling RF characteristics of a matcher may be used. Thus, it is difficult to control the plasma characteristics in a local area.

SUMMARY

Example embodiments provide a plasma processing apparatus capable of improving plasma asymmetry.

Example embodiments provide a plasma processing method using the plasma processing apparatus.

According to example embodiments, a plasma processing apparatus includes a chamber providing a space for processing a substrate, a substrate stage configured to support the substrate within the chamber and including a lower electrode, an upper electrode facing the lower electrode, a focus ring in or on an upper peripheral region of the substrate stage to surround the substrate, and a plasma adjustment assembly in at least one of a first position between the upper electrode and the lower electrode and a second position between the focus ring and the lower electrode, the plasma adjustment assembly including a photoreactive material layer and a plurality of light sources configured to irradiate light onto a local region of the photoreactive material layer. A capacitance of the local region is changed as the light is irradiated to the local region.

According to example embodiments, a plasma processing apparatus includes a chamber providing a space for processing a substrate, a substrate stage configured to support the substrate within the chamber, an upper electrode facing the substrate stage, a focus ring in or on an upper peripheral region of the substrate stage to surround the substrate, a photoreactive material layer between the upper electrode and the substrate stage or between the focus ring and the substrate stage and including a material whose capacitance is changeable according to an irradiated light, a plurality of light sources between the upper electrode and the photoreactive material layer or between the substrate stage and the photoreactive material layer and configured to irradiate light onto the photoreactive material layer, and a power control portion configured to independently control operations of the plurality of light sources to irradiate the light to a local region of the photoreactive material layer.

According to example embodiments, a plasma processing apparatus includes a chamber providing a space for processing a substrate, a substrate stage configured to support the substrate within the chamber and including a lower electrode, an upper electrode facing the lower electrode, a focus ring in or on an upper peripheral region of the substrate stage to surround the substrate, a first plasma adjustment assembly between the upper electrode and the lower electrode, and including a first photoreactive material layer and a plurality of first light sources configured to irradiate light onto a local region of the first photoreactive material layer, wherein a capacitance of the local region of the first photoreactive material layer is changed when the light is irradiated to the local region of the first photoreactive material layer, and a second plasma adjustment assembly between the focus ring and the lower electrode, and including a second photoreactive material layer and a plurality of second light sources configured to irradiate light onto a local region of the second photoreactive material layer, wherein a capacitance of the local region of the second photoreactive material layer is changed when the light is irradiated to the local region of the second photoreactive material layer.

According to example embodiments, in a plasma processing method, a photoreactive material layer is arranged in at least one of a first position between an upper electrode and a lower electrode and a second position between a focus ring and the lower electrode, the photoreactive material layer including a material whose capacitance is changeable according to an amount of light or light wavelength. A plurality of light sources is arranged to be configured to irradiate light onto the photoreactive material layer. A substrate is loaded onto a substrate stage within a chamber. Plasma is generated within the chamber. The plurality of light sources are independently controlled to irradiate light to a local region of the photoreactive material layer. A plasma process is performed on the substrate.

According to example embodiments, a plasma processing apparatus may include a plasma adjustment assembly configured to change a capacitance in a local region between an upper electrode and a lower electrode or between a focus ring and a substrate stage to thereby perform local plasma control. The plasma adjustment assembly may include a photoreactive material layer arranged between the upper electrode and the lower electrode or between the focus ring and the substrate stage and a light array having a plurality of light sources for irradiating light to a local region of the photoreactive material layer.

Accordingly, by controlling the light sources independently, the capacitance between the upper electrode and the lower electrode or between the focus ring and the lower electrode may be locally changed. Thus, it may be possible to improve the yield of process by improving plasma uniformity through the local plasma control.

BRIEF DESCRIPTION OF THE DRAWINGS

Example embodiments will be more clearly understood from the following detailed description taken in conjunction with the accompanying drawings. FIGS. 1 to 17 represent non-limiting, example embodiments as described herein.

FIG. 1 is a block diagram illustrating a plasma processing apparatus in accordance with example embodiments.

FIG. 2 is an enlarged cross-sectional view illustrating portion 'A' in FIG. 1.

FIG. 3 is a plan view illustrating a plasma adjustment assembly arranged under a shower head in FIG. 1.

FIG. 4 includes graphs illustrating a change of capacitance with respect to a wavelength of a photoreactive material layer of the plasma adjustment assembly in FIG. 3.

FIG. 5 is a circuit diagram illustrating capacitors formed in the plasma processing apparatus in FIG. 1.

FIG. 6 is a flow chart illustrating a plasma processing method in accordance with example embodiments.

FIG. 7 is a block diagram illustrating a plasma processing apparatus in accordance with example embodiments.

FIG. 8 is an enlarged cross-sectional view illustrating portion 'B' in FIG. 7.

FIG. 9 is a plan view illustrating a plasma adjustment assembly arranged under a focus ring in FIG. 7.

FIG. 10 is a circuit diagram illustrating capacitors formed in the plasma processing apparatus in FIG. 7.

FIG. 11 is a flow chart illustrating a plasma processing method in accordance with example embodiments.

FIG. 12 is a block diagram illustrating a plasma processing apparatus in accordance with example embodiments.

FIG. 13 is an enlarged cross-sectional view illustrating portion 'C' in FIG. 12.

FIG. 14 is a circuit diagram illustrating capacitors formed in the plasma processing apparatus in FIG. 12.

FIG. 15 is a flow chart illustrating a plasma processing method in accordance with example embodiments.

FIG. 16 is a block diagram illustrating a plasma processing apparatus in accordance with example embodiments.

FIG. 17 is a flow chart illustrating a plasma processing method in accordance with example embodiments.

DETAILED DESCRIPTION

Hereinafter, example embodiments will be explained in detail with reference to the accompanying drawings.

Figure 1:
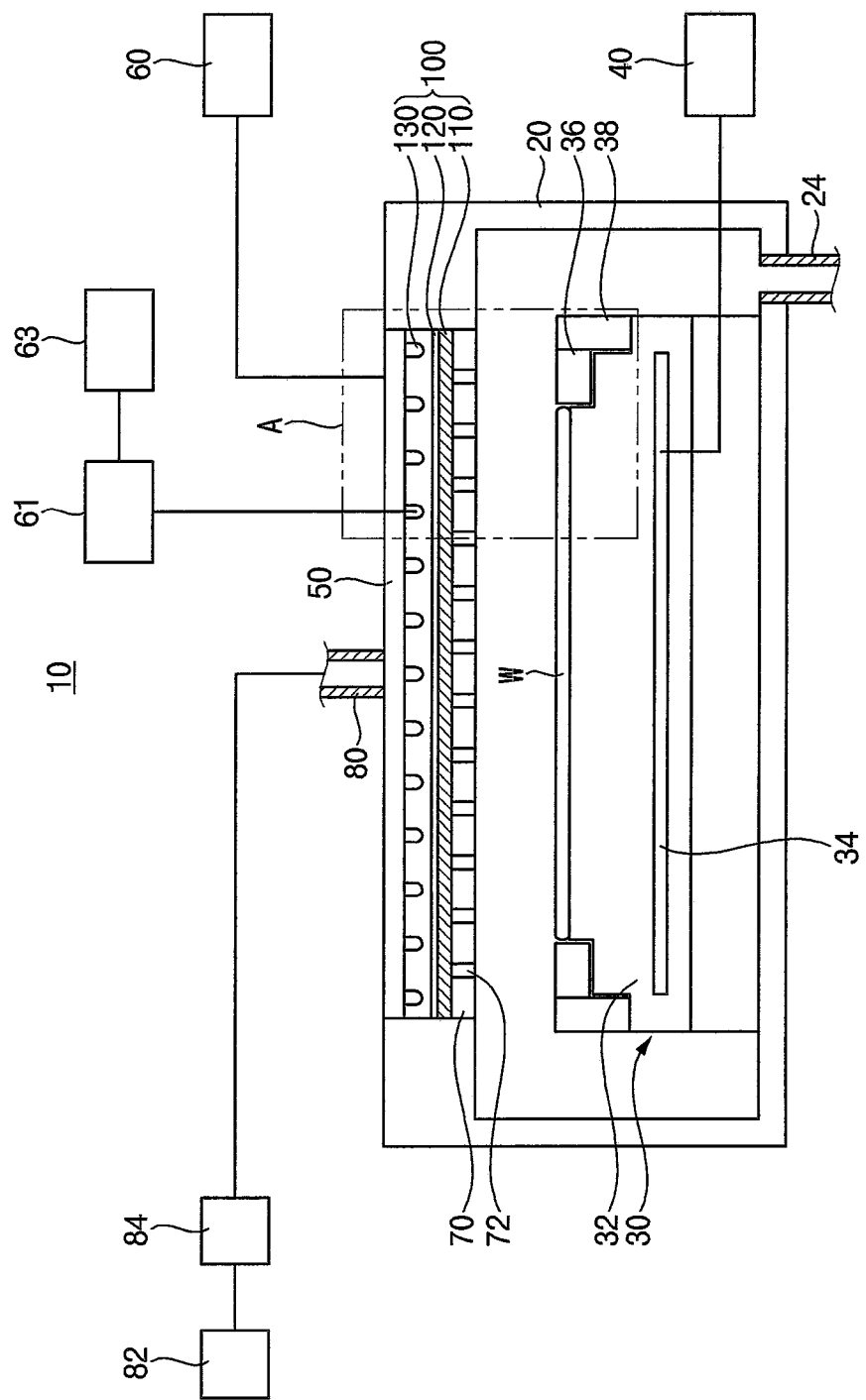
Figure 2:
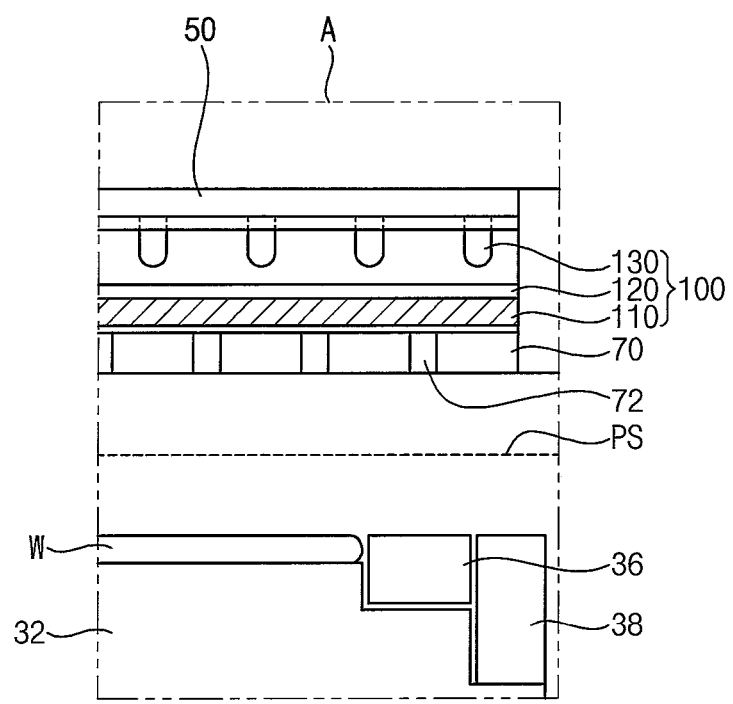
Figure 3:
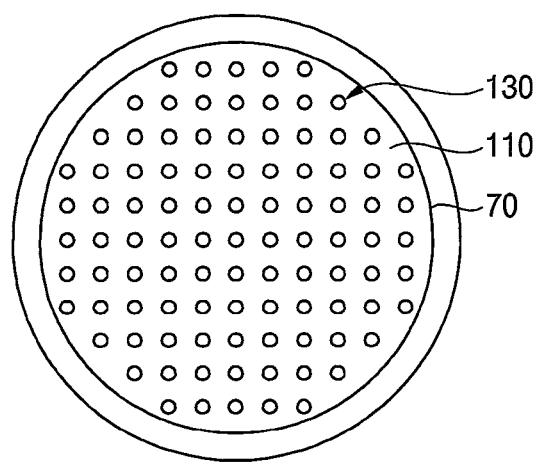
Figure 4:
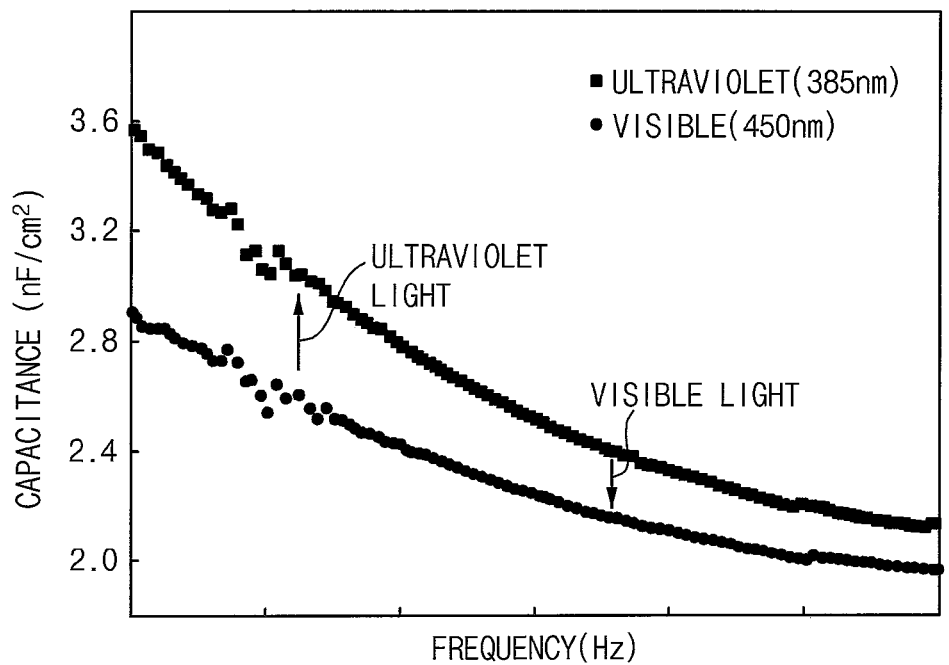
Figure 5:
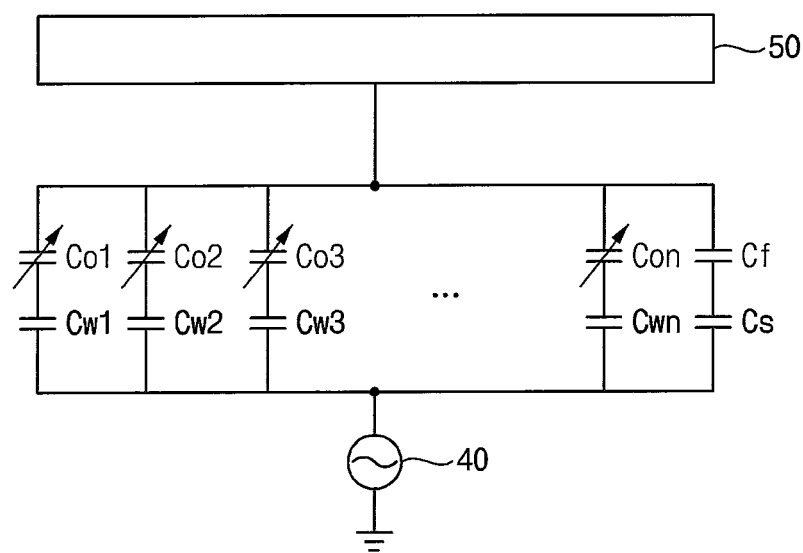

FIG. 1 is a block diagram illustrating a plasma processing apparatus in accordance with example embodiments. FIG. 2 is an enlarged cross-sectional view illustrating portion 'A' in FIG. 1. FIG. 3 is a plan view illustrating a plasma adjustment assembly arranged under a shower head in FIG. 1. FIG. 4 includes graphs illustrating a change of capacitance with respect to a wavelength of a photoreactive material layer of the plasma adjustment assembly in FIG. 3. FIG. 5 is a circuit diagram illustrating capacitors formed in the plasma processing apparatus in FIG. 1.

Referring to FIGS. 1 to 5, a plasma processing apparatus 10 may include a chamber 20, a substrate stage 30 having a lower electrode 34, an upper electrode 50, a focus ring 36 and a plasma adjustment assembly 100. Additionally, the plasma processing apparatus 10 may further include a first power supply 40, a second power supply 60, a gas supply unit, a gas exhaust unit, etc.

In example embodiments, the plasma processing apparatus 10 may be an apparatus configured to etch a layer on a substrate such as a semiconductor wafer W disposed within a capacitively coupled plasma (CCP) chamber. However, the plasma generated by the plasma processing apparatus may not be limited to the capacitively coupled plasma, and, for example, inductively coupled plasma may be generated by the plasma processing apparatus. Additionally, the plasma processing apparatus may not be limited to the etching apparatus, and, for example, may be used for a deposition apparatus, a cleaning apparatus, etc. Here, the substrate may include a semiconductor substrate, a glass substrate, etc.

The chamber 20 may provide a sealed space where a plasma etch process is performed on the wafer W. The chamber 20 may be a cylindrical shaped vacuum chamber. The chamber 20 may include a metal such as aluminum, stainless steel, etc. A gate (not illustrated) for opening and closing a loading/unloading port of the wafer W may be provided in a sidewall of the chamber 20. The wafer W may be loaded/unloaded onto/from the substrate stage through the gate.

A gas exhaust port 24 may be provided in a bottom portion of the chamber 20, and a gas exhaust unit may be connected to the gas exhaust port 24 through a gas exhaust line. The gas exhaust unit may include a vacuum pump such as a turbo-molecular pump or the like, to control a pressure of the chamber 20 so that the processing space inside the chamber 20 may be depressurized to a desired vacuum level. Additionally, process by-products and residual process gases may be discharged through the exhaust port 24.

The substrate stage 30 may be arranged within the chamber 20 to support the substrate. For example, the substrate stage 30 may serve as a susceptor for supporting the wafer W thereon. The substrate stage 30 may include a support plate or support body 32 having an electrostatic electrode for holding the wafer W using electrostatic force.

The substrate stage 30 may include the circular plate-shaped lower electrode 34 in the support plate 32. The substrate stage 30 may be installed to be movable upwardly and downwardly by a driving portion (not illustrated).

In example embodiments, the focus ring 36 may be arranged on the substrate stage 30 to surround an outer peripheral surface of the wafer W supported on the support plate 32. The focus ring 36 may have a ring shape to surround the wafer W. The focus ring 36 may prevent plasma from being concentrated on the outer peripheral surface of the wafer W during a plasma processing process performed on the wafer W.

An insulation ring 38 may be arranged on the substrate stage 30 to surround an outer peripheral surface of the focus ring 36. The insulation ring 38 may have a ring shape to surround the focus ring 36. For example, the focus ring 38 may include a material different from the focus ring 36. The focus ring 36 may include quartz, silicon carbide (SiC), silica (SiO2), etc. The insulation ring 38 may include an insulating material such as quartz.

Although it is not illustrated in the drawings, a pad, a support ring, or the like may be provided for supporting the focus ring 36 and the insulating ring 38. For example, the pad may include a conductive material, an adhesive material, or the like. The support ring may include an insulating material such as quartz.

The upper electrode 50 may be disposed over the substrate stage 30 such that the upper electrode 50 faces the lower electrode 34. The chamber space between the upper electrode 50 and the lower electrode 34 may be used as a plasma generation region. The upper electrode 50 may have a surface that faces the wafer W on the substrate stage 30.

The upper electrode 50 may be supported in an upper portion of the chamber 20 by an insulation shield member (not illustrated). The upper electrode 50 may be provided as a part of a shower head for supplying a gas into the chamber 20. The upper electrode 50 may have an electrode plate having a circular shape. The upper electrode 50 may include a plurality of injection holes which are formed to penetrate through the upper electrode 50 to supply the gas into the chamber 20.

In particular, the shower head may include a shower head body 70 which supports the upper electrode 50 and diffuses the gas that is supplied through the upper electrode 50, into the chamber 20. Although it is not illustrated in the drawings, the shower head body 70 may include a gas diffusion chamber 54 therein, and the gas diffusion chamber may be connected to injection holes 72 formed in the shower head body 70.

The gas supply unit may include a gas supply line 80, a flow controller 84 and a gas supply source 82, such as gas supply elements. The gas supply line 80 may be connected to the gas diffusion chamber of the shower head body 70, and the flow controller 84 may control a supply amount of the gas supplied into the chamber 20 through the gas supply line 80. For example, the gas supply source 82 may include a plurality of gas tanks, and the flow controller 84 may include a plurality of mass flow controllers (MFCs) corresponding to the gas tanks. The mass flow controllers may control independently the supply amounts of the gases respectively.

The first power supply 40 and the second power supply 60 may apply radio frequency powers to the lower electrode 34 and the upper electrode 50 respectively to form the plasma from a process gas within the chamber 20 using RF electric field formed between the upper and lower electrodes. The upper electrode 50 may receive RF power from the second power supply 60, and may be synchronized with the lower electrode 34 to excite a source gas supplied to the chamber 20 to plasma.

A controller may be connected to the first power supply 40 and the second power supply 60 and control operations thereof. The controller may have a microcomputer and various interface circuits and may control an operation of the plasma processing apparatus based on programs and recipe information stored in an external or internal memory.

As illustrated in FIGS. 2 and 3, in example embodiments, the plasma adjustment assembly 100 may change a capacitance in a local region between the upper electrode 50 and the lower electrode 34 to perform local plasma control.

The plasma adjustment assembly 100 may include a photoreactive material layer 110 disposed between the upper electrode 50 and the lower electrode 34 and a light array having a plurality of light sources 130 configured to irradiate light to a local region of the photoreactive material layer 110. Additionally, the plasma adjustment assembly 100 may further include a light diffusion layer 120 disposed between the photoreactive material layer 110 and the light array to diffuse the light from the light source 130.

The plasma adjustment assembly 100 may be disposed in the shower head. In particular, the photoreactive material layer 110 may be arranged on the shower head body 70 under the upper electrode 50. The photoreactive material layer 110 may have a circular shape corresponding to the upper electrode 50. The photoreactive material layer 110 may arranged between the upper electrode 50 and the support plate 32.

A plurality of the light sources 130 may be arranged on or over the photoreactive material layer 110 under the upper electrode 50. A plurality of the light sources 130 may be arranged in an array shape over the entire surface of the photoreactive material layer 110. The light sources 130 may be independently controlled to irradiate light to a local region of the photoreactive material layer 110. For example, the light source 130 may irradiate light having a wavelength in a range of 330 nm to 850 nm.

The light diffusion layer 120 may be arranged between the light array and the photoreactive material layer 110 to diffuse the light from the light sources 130. For example, the light diffusion layer 120 may include a material having excellent transmittance such as polycarbonate or quartz. At least one surface of the light diffusion layer 120 may have a surface roughness for scattering light. For example, the light diffusion layer 120 may include a plurality of intaglio or embossed structures formed on the surface.

In example embodiments, the photoreactive material layer 110 may include a material whose capacitance is changeable according to an amount of light or light wavelength. For example, the photoreactive material layer 110 may include ceramic, polymer, etc. Examples of the ceramic material may be hafnium oxide ($HfO_2$), silica ($SiO_2$), gallium arsenide (GaAs), etc. Examples of the polymer may be diarylethane-based polymers or diarylethene-based polymers.

In case that the photoreactive material layer is formed of a multi-layered thin film of the ceramic material, when the multi-layered thin film is irradiated with light, an electrical conductivity between interfaces of the stacked materials may vary according to the light, so that the capacitance of the photoreactive material layer may be changed.

In case that the photoreactive material layer is formed of a single or multi-layered thin film of the polymer material, when the thin film is irradiated with light, the photoreactive material layer may have dipole arrangements, so that the capacitance of the photoreactive material layer may be changed.

FIG. 4 shows a change in capacitance according to wavelength in case that a photoreactive material layer includes a multilayer thin film of a polymer layer and a metal layer stacked on each other. In this case, the metal layer may include a metal such as gold (Au), silver (Ag), etc.

As illustrated in FIG. 4, when the photoreactive material layer is irradiated with ultraviolet light, the capacitance of the photoreactive material layer may increase, while when the photoreactive material layer is irradiated with visible light, the capacitance of the photoreactive material layer may decrease. The capacitance of the photoreactive material layer may vary depending on the amount of light or wavelength.

In example embodiments, a plurality of the light sources 130 may be connected to a power control portion 61 (FIG. 1). The power control portion 61 may be connected to the controller 63 to independently provide power to the light sources 130 under the control of the controller 63. The amount and wavelength of light of the light source 130 may be controlled by the power control portion 61.

For example, the power control portion 61 or the controller 63 may provide power to only some of the light sources 130 such that light is irradiated to a local region of the photoreactive material layer 110. Accordingly, the capacitance of the local region of the photoreactive material layer 110 irradiated with the light may be adjusted by the amount or wavelength of the light.

As illustrated in FIG. 5, as the plasma is generated within the chamber 20, a capacitive path may be formed. For example, the capacitive path may include a first capacitor and a second capacitor. The first capacitor may be a capacitor formed between the support plate 32 and the upper electrode 50. The second capacitor may include a capacitor Cs formed between the support plate 32 and the focus ring 36 and a capacitor Cf formed between the focus ring 36 and a plasma sheath PS.

The first capacitor may include a capacitor of the photoreactive material layer 110. Since the photoreactive material layer 110 is located on a plane parallel with the upper electrode 50, the photoreactive material layer 110 may have variable capacitances ($Co_1$, $Co_2$, $Co_3$, ..., $Co_n$) in a plane shape. Each of the variable capacitances may be changed by the amount of light or wavelength of the light source 130. Accordingly, the light sources 130 may be controlled independently, to locally change the capacitance between the support plate 32 and the upper electrode 50. Additionally, as the capacitance between the support plate 32 and the upper electrode 50 is changed locally, the second capacitance may be changed locally. Thus, plasma asymmetry may be improved through the local plasma control of the plasma processing apparatus 10.

As mentioned above, the plasma processing apparatus 10 may include the plasma adjustment assembly 100 configured to change a capacitance in a local region between the upper electrode 50 and the lower electrode 34 to thereby perform local plasma control. The plasma adjustment assembly 100 may include the photoreactive material layer 110 arranged between the upper electrode 50 and the lower electrode 34 and the light array having a plurality of the light sources 130 for irradiating light to the local region of the photoreactive material layer 110.

Accordingly, by controlling the light sources 130 independently, the capacitance between the support plate 32 and the upper electrode 50 may be locally changed. Thus, it may be possible to improve the yield of process by improving plasma uniformity through the local plasma control of the plasma processing apparatus 10.

Hereinafter, a method of processing a substrate using the plasma processing apparatus in FIG. 1 will be explained.

Figure 6:
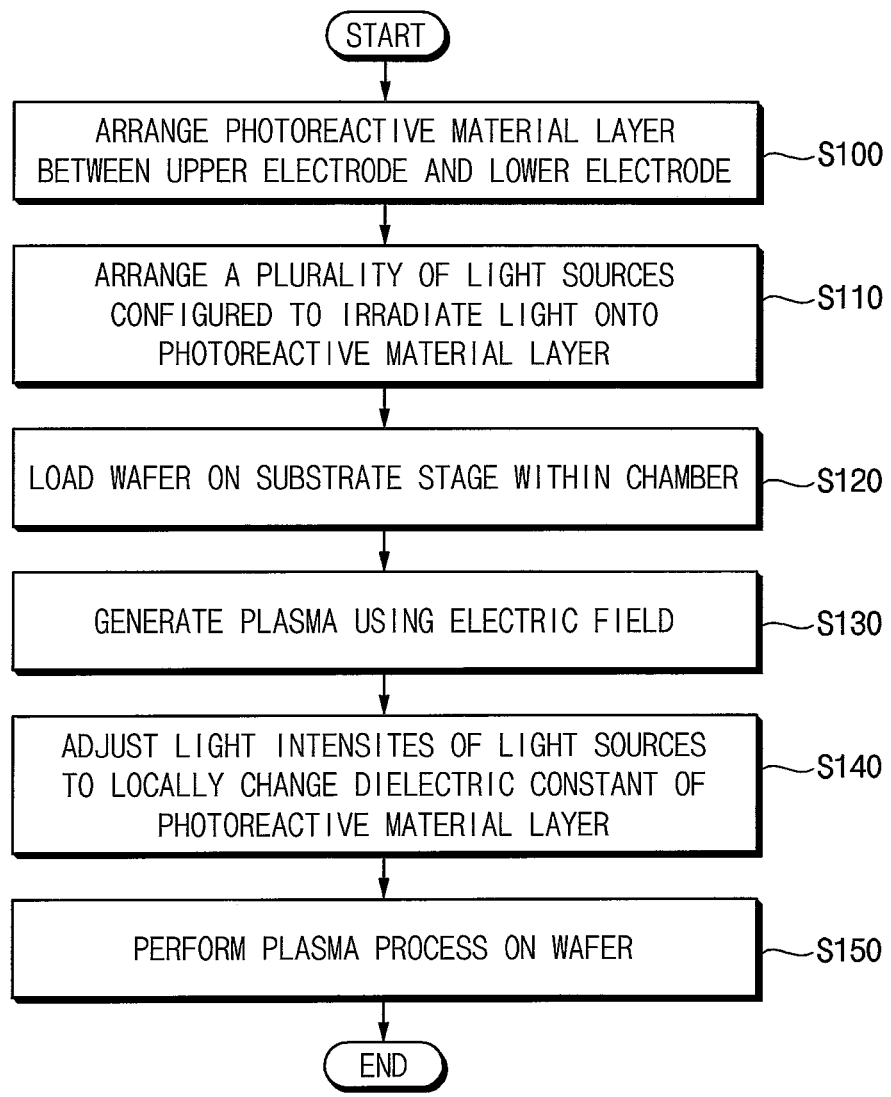

FIG. 6 is a flow chart illustrating a plasma processing method in accordance with example embodiments.

Referring to FIGS. 1, 2, 5 and 6, a plasma adjustment assembly 100 may be arranged between an upper electrode 50 and a lower electrode 34 of a plasma processing apparatus 10. In particular, a photoreactive material layer 110 may be arranged between the upper electrode 50 and the lower electrode 34 (S100), and a plurality of light sources 130 configured to irradiate light to a local region of the photoreactive material layer 110 may be arranged on the photoreactive material layer 110 (S110).

In example embodiments, the plasma adjustment assembly 100 may be disposed in a shower head. The photoreactive material layer 110 may be disposed on a shower head body 70 under the upper electrode 50, and a plurality of the light sources 130 may be arranged on the photoreactive material layer 110 under the upper electrode 50. A light diffusion layer 120 may be additionally arranged between the light array and the photoreactive material layer 110 to diffuse the light from the light sources 130.

The photoreactive material layer 110 may have a circular shape corresponding to the upper electrode 50. A plurality of the light sources 130 may be arranged in an array shape over the entire surface of the photoreactive material layer 110. The light sources 130 may be independently controlled to irradiate light to a local region of the photoreactive material layer 110. For example, the light source 130 may irradiate light having a wavelength in a range of 330 nm to 850 nm.

The photoreactive material layer 110 may include a material whose capacitance is changeable according to an amount of light or light wavelength. For example, the photoreactive material layer 110 may include ceramic, polymer, etc. Examples of the ceramic material may be hafnium oxide (HfO2), silica (SiO2), gallium arsenide (GaAs), etc. Examples of the polymer may be diarylethane-based polymers or diarylethene-based polymers.

A plurality of the light sources 130 may be connected to a power control portion 61. The power control portion 61 may be connected to a controller 63 to independently provide power to the light sources 130 under the control of the controller 63. The amount and wavelength of light of the light source 130 may be controlled by the power control portion 61 or the controller 63.

Then, a wafer W may be loaded onto a substrate stage 30 within a capacitively coupled plasma (CCP) chamber 20 (S120), and plasma may be generated within the plasma chamber 20 using an electric field (S130).

In particular, the semiconductor wafer W may be loaded on an electrostatic electrode of the substrate stage 30 within the chamber 20. A plasma gas may be introduced through injection holes 72 of the shower head, and a pressure of the chamber 20 may be depressurized to a desired vacuum level by a gas exhaust unit. Then, radio frequency powers may be applied to the lower electrode 34 and the upper electrode 50 to generate plasma within the chamber 20.

Then, a light amount (or wavelength) of the light sources 130 may be adjusted to locally change a capacitance of the photoreactive material layer 110 (S140), and a plasma process may be performed on the wafer W (S150).

For example, the power control portion 61 or the controller 63 may provide power to only some of the light sources 130 such that light is irradiated to a local region of the photoreactive material layer 110. Accordingly, the capacitance of the local region of the photoreactive material layer 110 irradiated with the light may be adjusted by the amount or wavelength of the light.

As illustrated in FIG. 5, since the photoreactive material layer 110 is located on a plane parallel with the upper electrode 50, the photoreactive material layer 110 may have variable capacitances (Co1, Co2, Co3, . . . , Con) in a plane shape. Each of the variable capacitances may be changed by the amount of light or wavelength of the light source 130. Accordingly, the light sources 130 may be controlled independently, to locally change the capacitance between the support plate 32 and the upper electrode 50. Thus, plasma uniformity may be improved through the local plasma control of the plasma processing apparatus 10.

Figure 7:
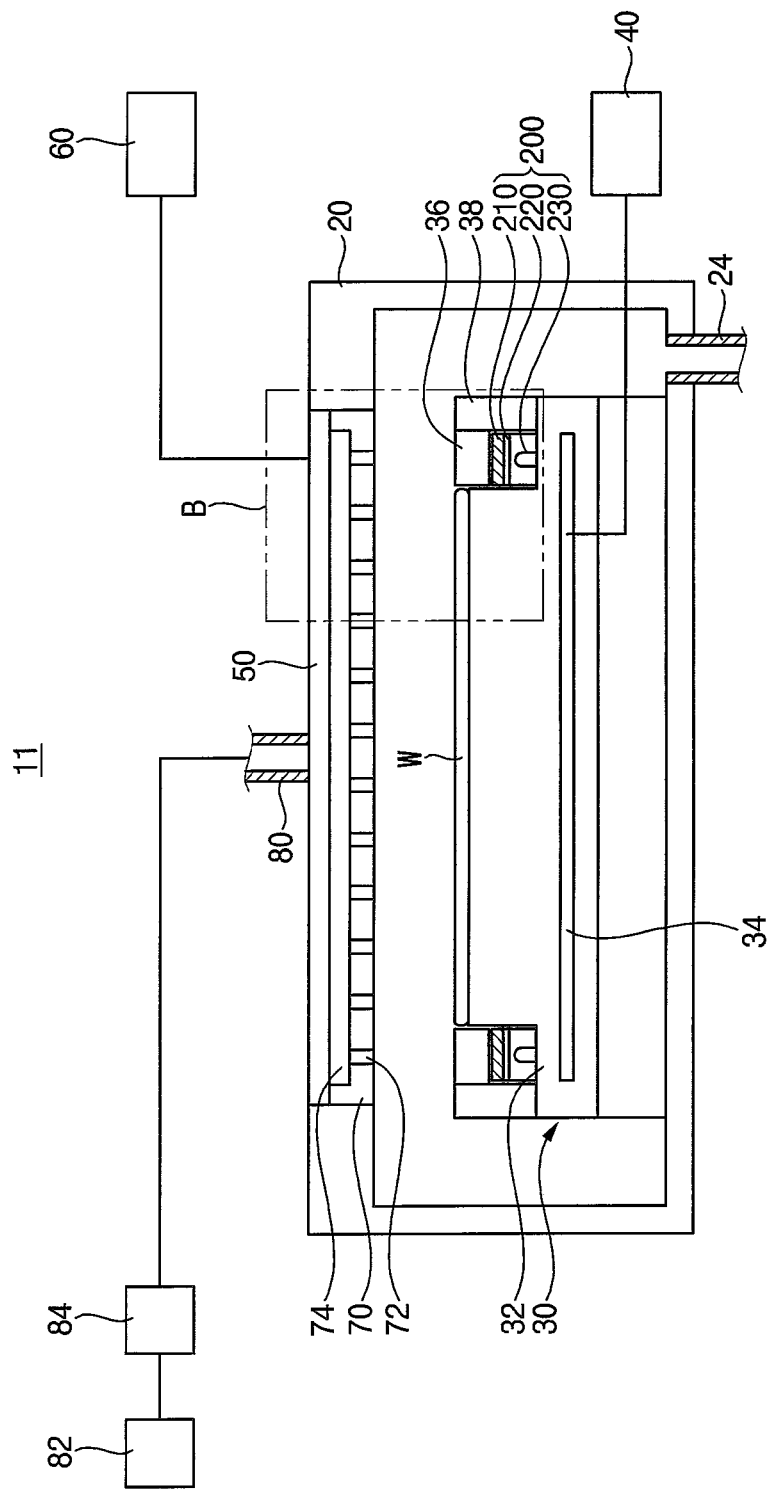
Figure 8:
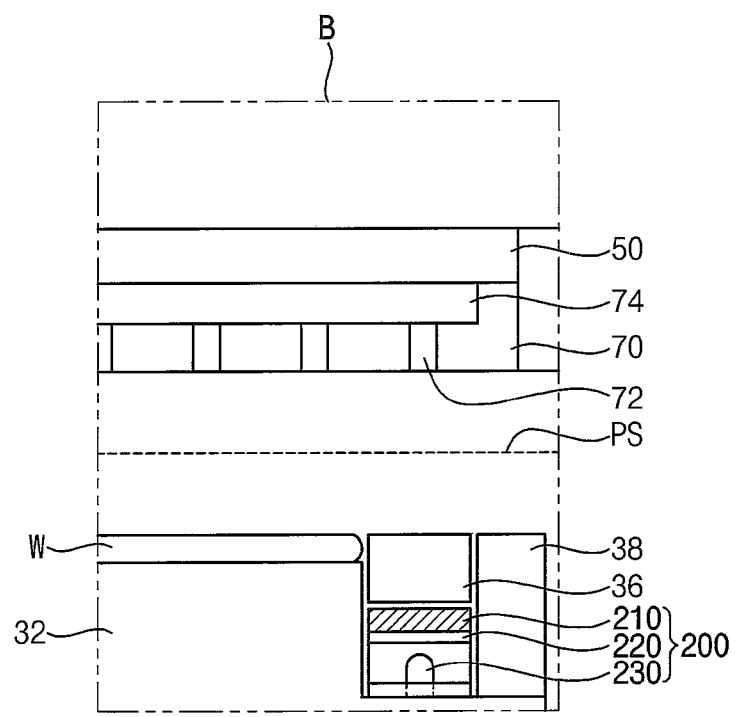
Figure 9:
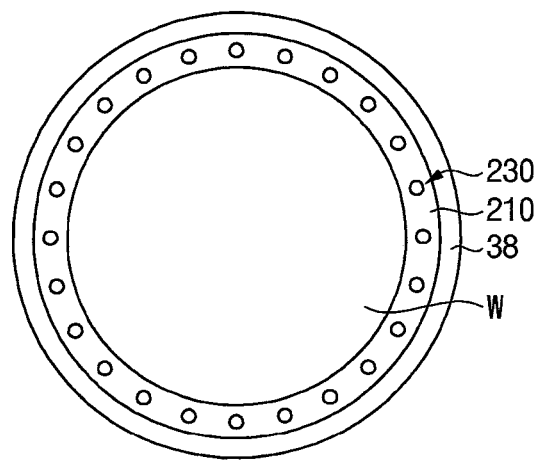
Figure 10:
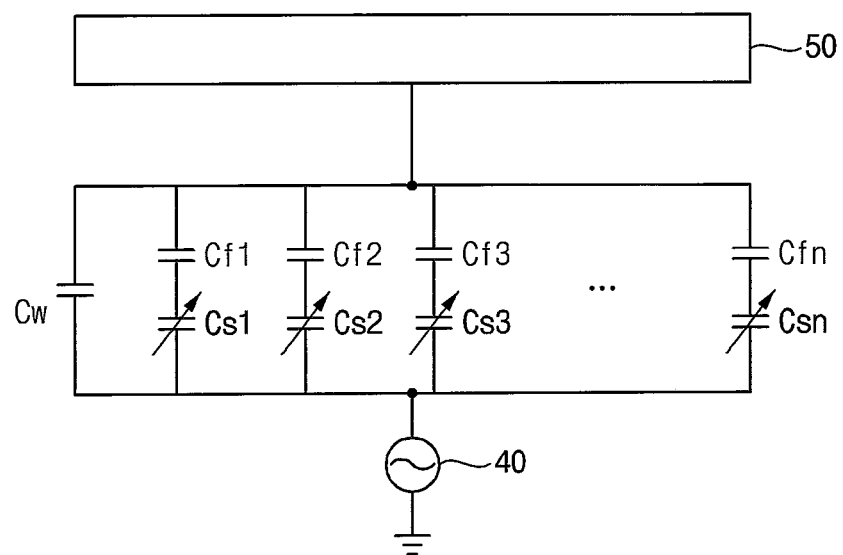

FIG. 7 is a block diagram illustrating a plasma processing apparatus in accordance with example embodiments. FIG. 8 is an enlarged cross-sectional view illustrating portion 'B' in FIG. 7. FIG. 9 is a plan view illustrating a plasma adjustment assembly arranged under a focus ring in FIG. 7. FIG. 10 is a circuit diagram illustrating capacitors formed in the plasma processing apparatus in FIG. 7. The plasma processing apparatus may be substantially the same as or similar to the plasma processing apparatus described with reference to FIGS. 1 to 5 except for an arrangement and configuration of a plasma adjustment assembly. Thus, same reference numerals will be used to refer to the same or like elements and any further repetitive explanation concerning the above elements may be omitted in the interest of brevity.

Referring to FIGS. 7 to 10, a plasma processing apparatus 11 may include a plasma adjustment assembly 200 configured to change a capacitance in a local region between a focus ring 36 and a lower electrode 34 to perform local plasma control.

In example embodiments, the plasma adjustment assembly 200 may include a photoreactive material layer 210 arranged between the focus ring 36 and the lower electrode 34 and a light array having a plurality of light sources 230 configured to irradiate light to a local region of the photoreactive material layer 210. Additionally, the plasma adjustment assembly 200 may further include a light diffusion layer 220 arranged between the photoreactive material layer 210 and the light array to diffuse the light from the light source 230.

The plasma adjustment assembly 200 may be disposed in a substrate stage 30. In particular, the photoreactive material layer 210 may be arranged on a support plate or support body 32 under the focus ring 36. The photoreactive material layer 210 may have an annular or ring shape corresponding to the focus ring 36. The photoreactive material layer 210 may arranged between the focus ring 36 and the support plate 32.

A plurality of the light sources 230 may be arranged under the photoreactive material layer 210. A plurality of the light sources 230 may be arranged along an extending or circumferential direction of the photoreactive material layer 210 to be spaced apart from each other by a predetermined distance. The light sources 230 may be independently controlled to irradiate light to a local region of the photoreactive material layer 210. For example, the light source 230 may irradiate light having a wavelength in a range of 330 nm to 850 nm.

The light diffusion layer 220 may be arranged between the light array and the photoreactive material layer 210 to diffuse the light from the light sources 230. For example, the light diffusion layer 220 may include a material having excellent transmittance such as polycarbonate or quartz. At least one surface of the light diffusion layer 220 may have a surface roughness for scattering light.

As illustrated in FIG. 10, as plasma is generated within the chamber 20, a capacitive path may be formed. For example, the capacitive path may include a first capacitor and a second capacitor. The first capacitor may be a capacitor Cw formed between the support plate 32 and the upper electrode 50. The second capacitor may include a capacitor formed between the support plate 32 and the focus ring 36 and a capacitor formed between the focus ring 36 and the upper electrode 50.

The second capacitor may include a capacitor of the photoreactive material layer 210. Since the photoreactive material layer 210 is located on a plane parallel with the focus ring 36, the photoreactive material layer 210 may have variable capacitances (Cs1, Cs2, Cs3, . . . , Csn) in a plane shape. Each of the variable capacitances may be changed by the amount of light or wavelength of the light source 230. Accordingly, the light sources 230 may be controlled independently, to locally change the capacitance between the focus ring 36 and the lower electrode 34. Additionally, as the capacitance between the focus ring 36 and the lower electrode 34 is changed locally, the capacitance between the support plate 32 and the upper electrode 50 may be changed locally. Thus, plasma asymmetry may be improved through the local plasma control of the plasma processing apparatus 11.

Hereinafter, a method of processing a substrate using the plasma processing apparatus in FIG. 7 will be explained.

Figure 11:
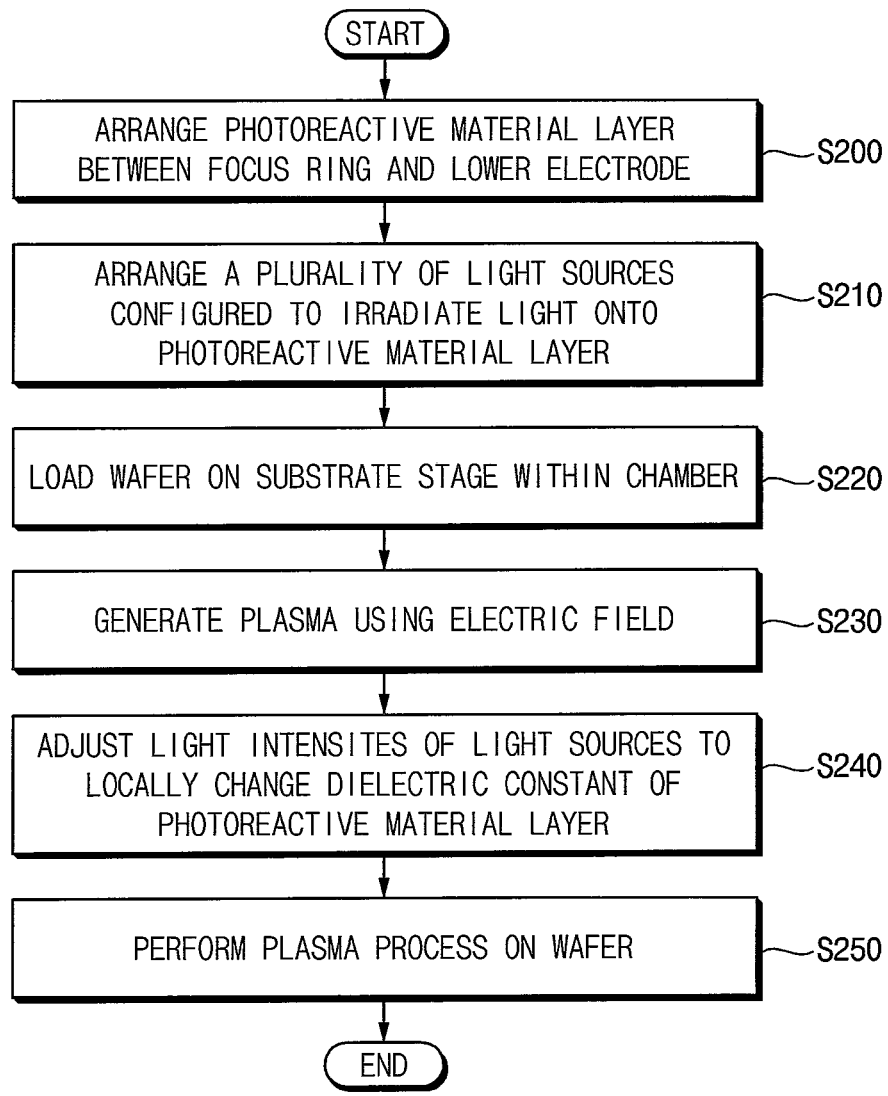

FIG. 11 is a flow chart illustrating a plasma processing method in accordance with example embodiments.

Referring to FIGS. 7 to 11, first, a plasma adjustment assembly 200 may be arranged between a focus ring 36 and a lower electrode 34 of a plasma processing apparatus 11. In particular, a photoreactive material layer 210 may be arranged between the focus ring 36 and the lower electrode 34 (S200), and a plurality of light sources 230 configured to irradiate light to a local region of the photoreactive material layer 210 may be arranged (S210).

In example embodiments, the plasma adjustment assembly 200 may be disposed in a substrate stage 30. The photoreactive material layer 210 may be disposed on a support plate 32 under the focus ring 36, and a plurality of the light sources 230 may be arranged on the photoreactive material layer 210 under the focus ring 36. A light diffusion layer 220 may be additionally arranged between the light array and the photoreactive material layer 210 to diffuse the light from the light sources 230.

The photoreactive material layer 210 may have an annular or ring shape corresponding to the focus ring 36. A plurality of the light sources 230 may be arranged along an extending or circumferential direction of the photoreactive material layer 210 to be spaced apart from each other by a predetermined distance. The light sources 230 may be independently controlled to irradiate light to a local region of the photoreactive material layer 210. For example, the light source 230 may irradiate light having a wavelength in a range of 330 nm to 850 nm.

The photoreactive material layer 210 may include a material whose capacitance is changeable according to an amount of light or light wavelength. For example, the photoreactive material layer 210 may include ceramic, polymer, etc.

A plurality of the light sources 230 may be connected to a power control portion (similar to 61 in FIG. 1). The power control portion may be connected to a controller (similar to 63 in FIG. 1) to independently provide power to the light sources 230 under the control of the controller. The amount and wavelength of light of the light source 230 may be controlled by the power control portion or the controller.

Then, a wafer W may be loaded onto a substrate stage 30 within a capacitively coupled plasma (CCP) chamber 20 (S220), and plasma may be generated within the plasma chamber 20 using an electric field (S230).

Then, a light amount (or wavelength) of the light sources 230 may be adjusted to locally change a capacitance of the photoreactive material layer 210 (S240), and a plasma process may be performed on the wafer W (S250).

For example, the power control portion or the controller may provide power to only some of the light sources 230 such that light is irradiated to a local region of the photoreactive material layer 210. Accordingly, the capacitance of the local region of the photoreactive material layer 210 irradiated with the light may be adjusted by the amount or wavelength of the light.

As illustrated in FIG. 10, since the photoreactive material layer 210 is located on a plane parallel with the focus ring 36, the photoreactive material layer 210 may have variable capacitances (Cs1, Cs2, Cs3, . . . , Csn) in a plane shape. Each of the variable capacitances may be changed by the amount of light or wavelength of the light source 230. Accordingly, the light sources 230 may be controlled independently, to locally change the capacitance between the focus ring 36 and the lower electrode 34. Additionally, as the capacitance between the focus ring 36 and the lower electrode 34 is changed locally, the capacitance between the support plate 32 and the upper electrode 50 may be changed locally. Thus, plasma uniformity may be improved through the local plasma control of the plasma processing apparatus 11.

Figure 12:
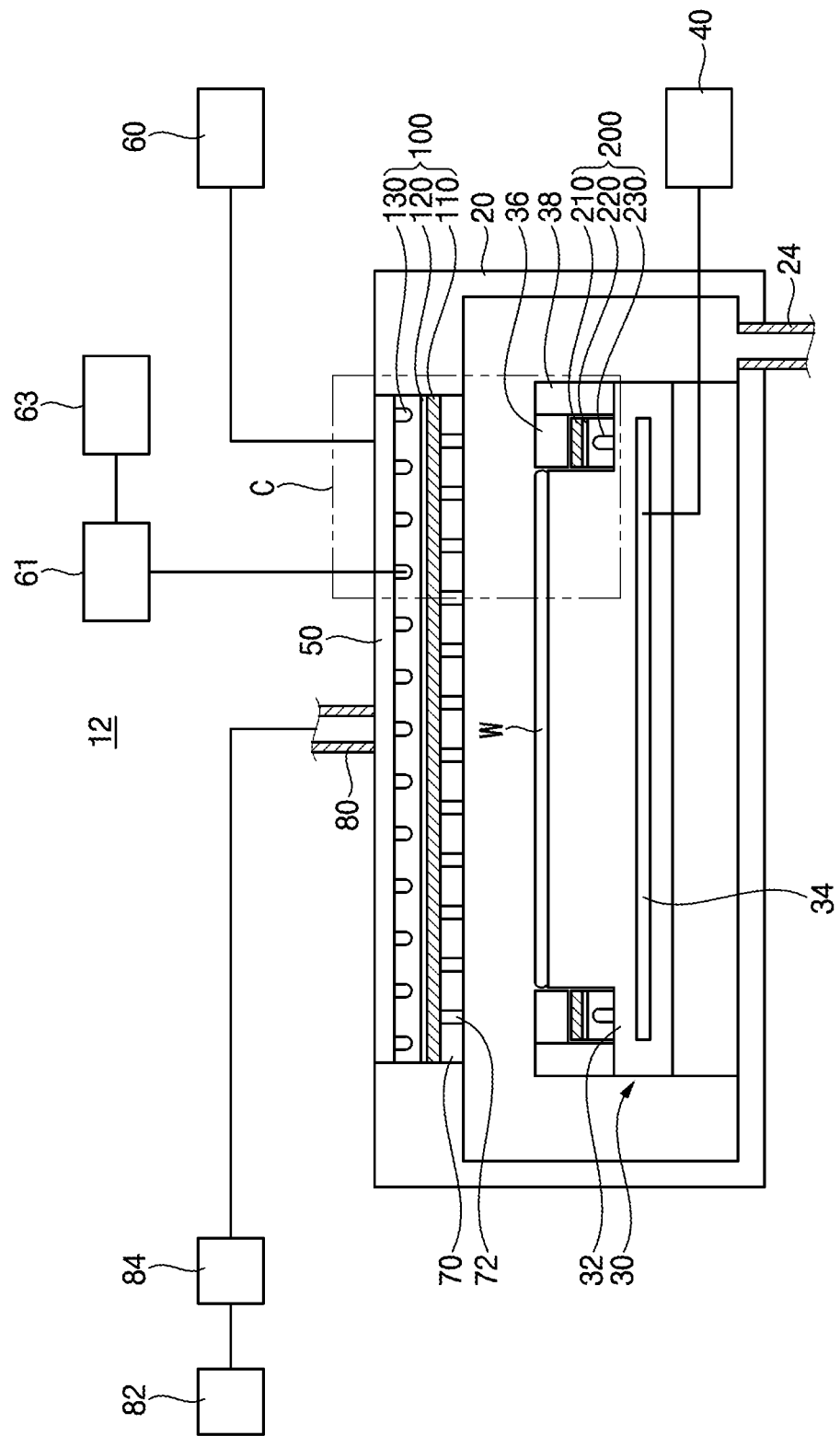
Figure 13:
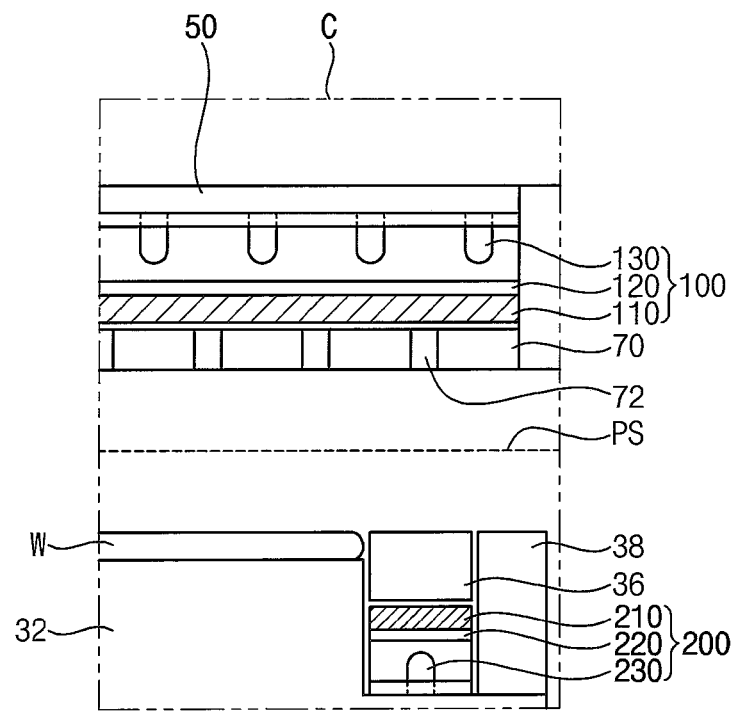
Figure 14:
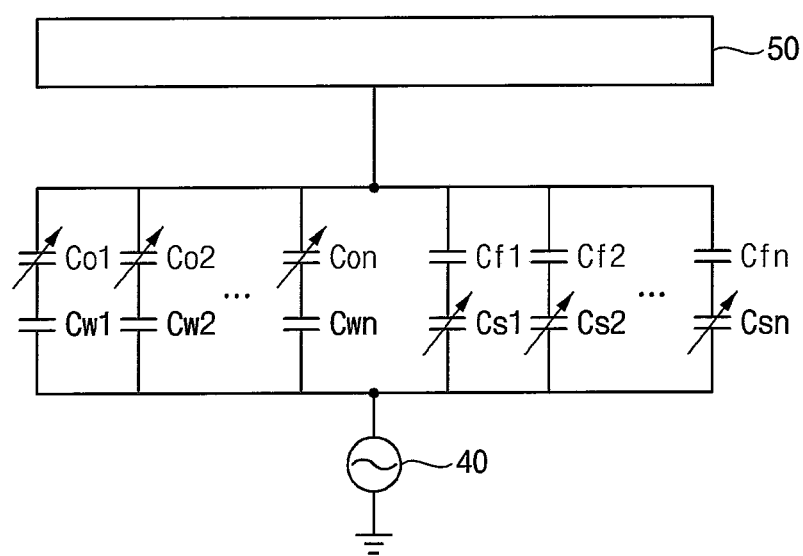

FIG. 12 is a block diagram illustrating a plasma processing apparatus in accordance with example embodiments. FIG. 13 is an enlarged cross-sectional view illustrating portion 'C' in FIG. 12. FIG. 14 is a circuit diagram illustrating capacitors formed in the plasma processing apparatus in FIG. 12. The plasma processing apparatus may be substantially the same as or similar to the plasma processing apparatus described with reference to FIGS. 1 to 5 except for arrangements of first and second plasma adjustment assemblies. Thus, same reference numerals will be used to refer to the same or like elements and any further repetitive explanation concerning the above elements may be omitted in the interest of brevity.

Referring to FIGS. 12 to 14, a plasma processing apparatus 12 may include a first plasma adjustment assembly 100 configured to change a capacitance in a local region between an upper electrode 50 and a lower electrode 34, and a second plasma adjustment assembly 200 configured to change a capacitance in a local region between a focus ring 36 and a lower electrode 34.

The first plasma adjustment assembly 100 may include a first photoreactive material layer 110 disposed between the upper electrode 50 and the lower electrode 34 and a first light array having a plurality of first light sources 130 configured to irradiate light to a local region of the first photoreactive material layer 110. Additionally, the first plasma adjustment assembly 100 may further include a first light diffusion layer 120 disposed between the first photoreactive material layer 110 and the first light array to diffuse the light from the first light source 130. The first plasma adjustment assembly may be substantially the same as or similar to the plasma adjustment assembly 100 in FIG. 1. Accordingly, a detailed description thereof will be omitted in the interest of brevity.

The second plasma adjustment assembly 200 may include a second photoreactive material layer 210 arranged between the focus ring 36 and the lower electrode 34 and a second light array having a plurality of second light sources 230 configured to irradiate light to a local region of the second photoreactive material layer 210. Additionally, the second plasma adjustment assembly 200 may further include a second light diffusion layer 220 arranged between the second photoreactive material layer 210 and the second light array to diffuse the light from the second light source 230. The second plasma adjustment assembly may be substantially the same as or similar to the plasma adjustment assembly 200 in FIG. 7. Accordingly, a detailed description thereof will be omitted in the interest of brevity.

As illustrated in FIG. 14, as plasma is generated within the chamber 20, a capacitive path may be formed. For example, the capacitive path may include a first capacitor and a second capacitor. The first capacitor may be a capacitor formed between the support plate 32 and the upper electrode 50. The second capacitor may include a capacitor formed between the support plate 32 and the focus ring 36 and a capacitor formed between the focus ring 36 and the upper electrode 50.

The first capacitor may include a capacitor of the first photoreactive material layer 110. Since the first photoreactive material layer 110 is located on a plane parallel with the upper electrode 50, the first photoreactive material layer 110 may have variable capacitances ($C_{o1}, C_{o2}, C_{o3}, \ldots, C_{on}$) in a plane shape. Each of the variable capacitances may be changed by the amount of light or wavelength of the first light source 130. Accordingly, the first light sources 130 may be controlled independently, to locally change the capacitance between the support plate 32 and the upper electrode 50.

The second capacitor may include a capacitor of the second photoreactive material layer 210. Since the second photoreactive material layer 210 is located on a plane parallel with the focus ring 36, the second photoreactive material layer 210 may have variable capacitances ($C_{s1}, C_{s2}, C_{s3}, \ldots, C_{sn}$) in a plane shape. Each of the variable capacitances may be changed by the amount of light or wavelength of the second light source 230. Accordingly, the second light sources 230 may be controlled independently, to locally change the capacitance between the focus ring 36 and the lower electrode 34.

Thus, plasma asymmetry may be improved through the local plasma control of the plasma processing apparatus 12.

Hereinafter, a method of processing a substrate using the plasma processing apparatus in FIG. 12 will be explained.

Figure 15:
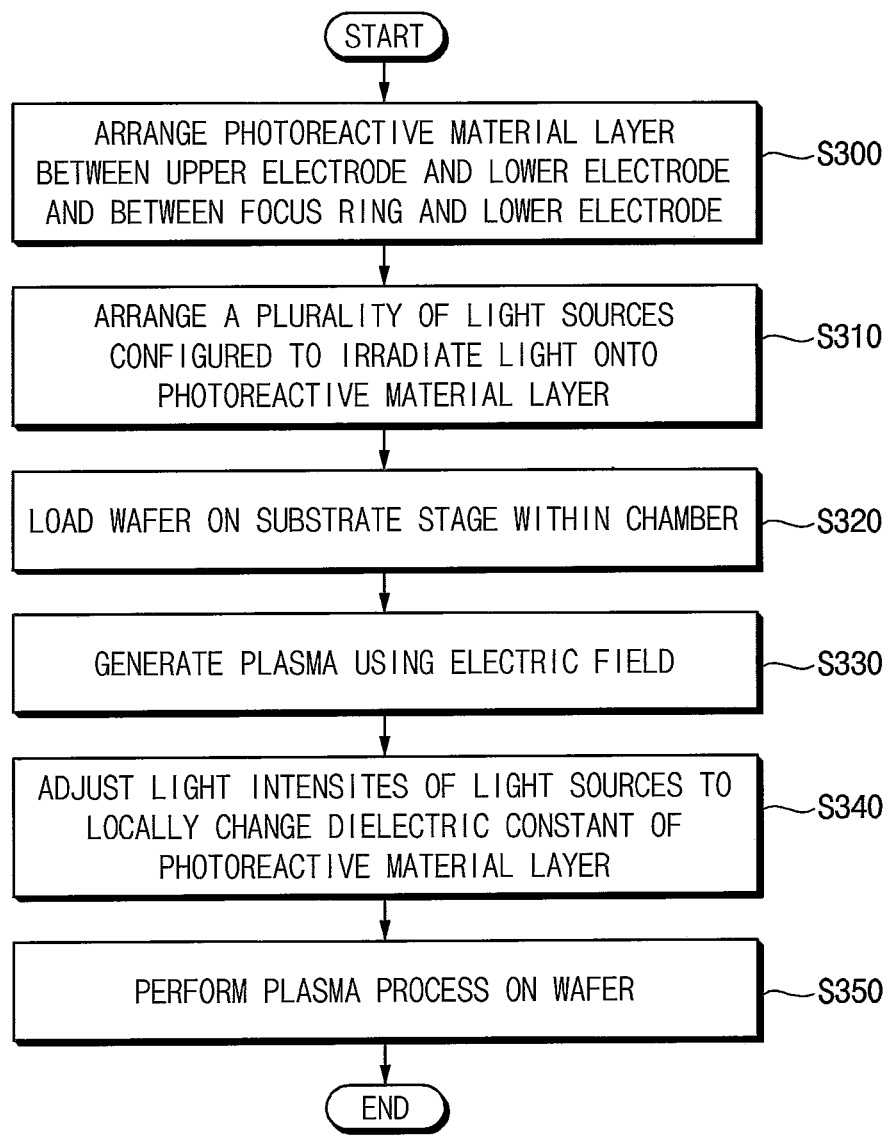

FIG. 15 is a flow chart illustrating a plasma processing method in accordance with example embodiments.

Referring to FIGS. 12 to 15, first, a first plasma adjustment assembly 100 may be arranged between an upper electrode 50 and a lower electrode 34, and a second plasma adjustment assembly 200 may be arranged between a focus ring 36 and the lower electrode 34. In particular, a first photoreactive material layer 110 may be arranged between the upper electrode 50 and the lower electrode 34 and a second photoreactive material layer 210 may be arranged between the focus ring 36 and the lower electrode 34 (S300), and a plurality of first and second light sources 130, 230 configured to irradiate light to a local region of the first and second photoreactive material layers 110, 210 may be arranged (S310).

In example embodiments, the first plasma adjustment assembly 100 may be disposed in a shower head. The first photoreactive material layer 110 may be disposed on a shower head body 70 under the upper electrode 50, and a plurality of the first light sources 130 may be arranged on the first photoreactive material layer 110 under the upper electrode 50. A first light diffusion layer 120 may be additionally arranged between the first light array and the first photoreactive material layer 110 to diffuse the light from the first light sources 130.

The second plasma adjustment assembly 200 may be disposed in a substrate stage 30. The second photoreactive material layer 210 may be disposed on a support plate 32 under the focus ring 36, and a plurality of the second light sources 230 may be arranged on the second photoreactive material layer 210 under the focus ring 36. A second light diffusion layer 220 may be additionally arranged between the second light array and the second photoreactive material layer 210 to diffuse the light from the second light sources 230.

A plurality of the first and second light sources 130, 230 may be connected to a power control portion 61. The power control portion may be connected to a controller 63 to independently provide power to the first and second light sources 130, 230 under the control of the controller. The amount and wavelength of light of the first and second light sources 130, 230 may be controlled by the power control portion or the controller.

Then, a wafer W may be loaded onto a substrate stage 30 within a capacitively coupled plasma (CCP) chamber 20 (S320), and plasma may be generated within the plasma chamber 20 using an electric field (S330).

Then, a light amount (or wavelength) of the first and second light sources 130, 230 may be adjusted to locally change capacitances of the first and second photoreactive material layers 110, 210 (S340), and a plasma process may be performed on the wafer W (S350).

For example, the power control portion or the controller may provide power to only some of the first and second light sources 130, 230 such that light is irradiated to local regions of the first and second photoreactive material layers 110, 210. Accordingly, the capacitances of the local regions of the first and second photoreactive material layers 110, 210 irradiated with the light may be adjusted by the amount or wavelength of the light.

As illustrated in FIG. 14, since the first photoreactive material layer 110 is located on a plane parallel to the upper electrode 50, the first photoreactive material layer 110 may have variable capacitances ($C_{o1}, C_{o2}, C_{o3}, \ldots, C_{on}$) in a plane shape. Each of the variable capacitances may be changed by the amount of light or wavelength of the first light source 130. Accordingly, the first light sources 130 may be controlled independently, to locally change the capacitance between the support plate 32 and the upper electrode 50.

Since the second photoreactive material layer 210 is located on a plane parallel with the focus ring 36, the second photoreactive material layer 210 may have variable capacitances (Cs1, Cs2, Cs3, . . . , Csn) in a plane shape. Each of the variable capacitances may be changed by the amount of light or wavelength of the second light source 230. Accordingly, the second light sources 230 may be controlled independently, to locally change the capacitance between the focus ring 36 and the lower electrode 34.

Thus, plasma asymmetry may be improved through the local plasma control of the plasma processing apparatus 12.

Figure 16:
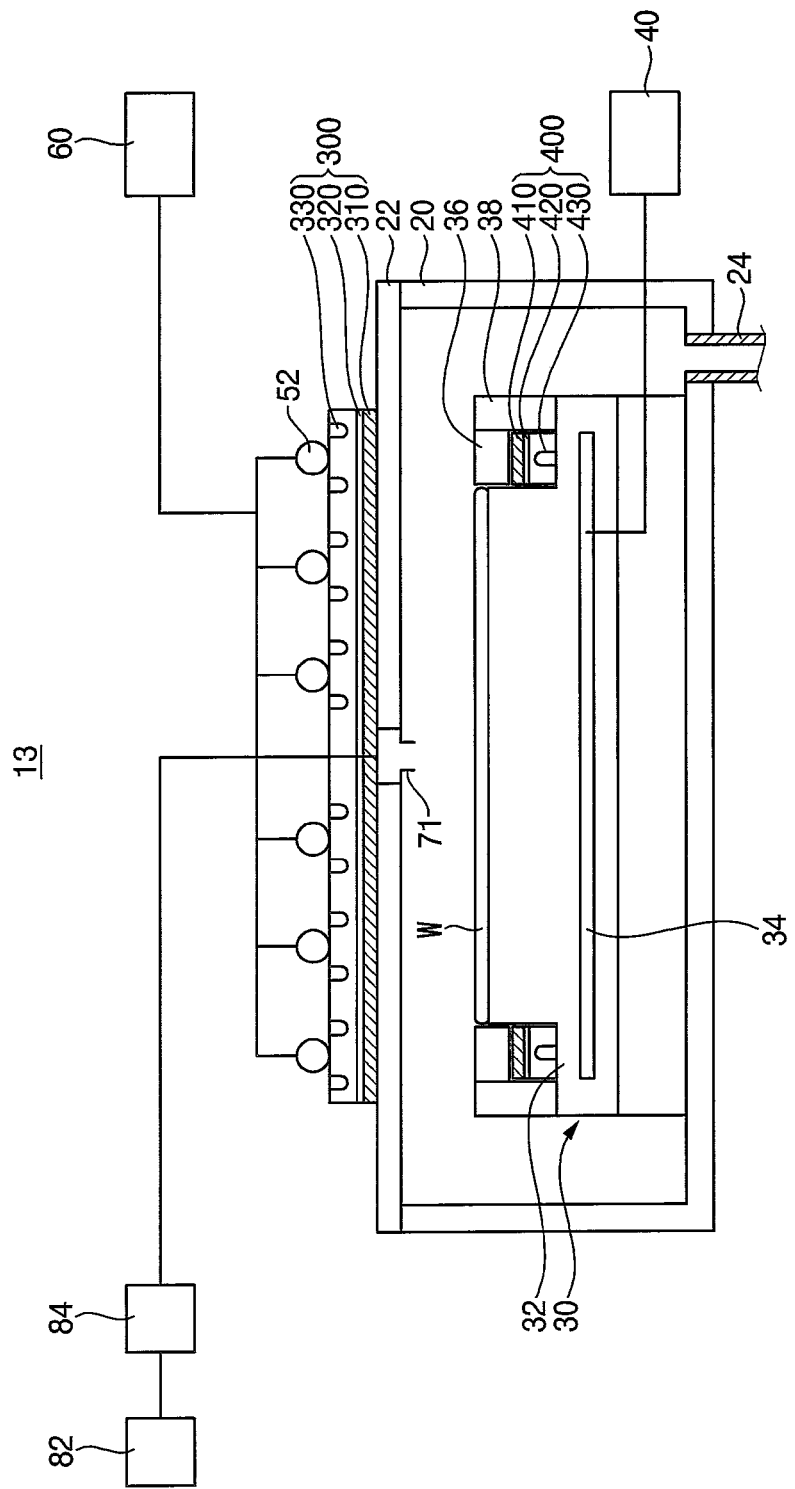

FIG. 16 is a block diagram illustrating a plasma processing apparatus in accordance with example embodiments. The plasma processing apparatus may be substantially the same as or similar to the plasma processing apparatus described with reference to FIGS. 12 to 14 except for a configuration of a plasma chamber. Thus, same reference numerals will be used to refer to the same or like elements and any further repetitive explanation concerning the above elements may be omitted in the interest of brevity.

Referring to FIG. 16, a plasma processing apparatus 13 may be an apparatus configured to etch a layer on the substrate such as a wafer W disposed within an inductively coupled plasma (ICP) chamber 20.

In example embodiments, the chamber 20 may include a cover 22 which covers an open upper end portion of the chamber 20. The cover 22 may airtightly seal the upper end portion of the chamber 20.

An upper electrode 52 may be disposed outside the chamber 20 such that the upper electrode 50 faces a lower electrode 34. The upper electrode 52 may be disposed on the cover 22. The upper electrode 52 may include a radio frequency antenna. The radio frequency antenna may have a plan coil shape. The cover 22 may include a circular plate shaped dielectric window. The dielectric window may include a dielectric material. For example, the dielectric window may include alumina ($Al_2O_3$). A power from the antenna may be transferred into the chamber 20 through the dielectric window.

For example, the upper electrode 52 may include coils having a spiral shape or a concentric shape. The coil may generate inductively coupled plasma in a space of the chamber 20. Herein, the coils may be described as examples, however, it may be understood that the number, arrangement, etc. of the coils may not be limited thereto.

The plasma processing apparatus 13 may include a gas supply unit for supplying a gas into the chamber 20. For example, the gas supply unit may include a gas supply line 71, a flow controller 84 and a gas supply source 82, such as gas supply elements. The gas supply line 71 may be connected to an upper portion (and/or a side portion) of the chamber 20 to supply the gases into the chamber 20 therethrough. For example, the gas supply line may include a vertical gas supply line which penetrates through the cover 22.

The second power supply 60 may apply a plasma source power to the upper electrode 52. For example, the second power supply 60 may include a source RF power source and a source RF matcher, such as plasma source elements. The source RF power source may generate a radio frequency (RF) signal. The source RF matcher may match impedance of the RF signal generated by the source RF power source using the coils to control generation of plasma.

The first power supply 40 may apply a bias source power to the lower electrode 34. For example, the second power supply 40 may include a bias RF power supply and a bias RF matcher, such as bias elements. The lower electrode 34 may attract plasma atoms or ions generated within the chamber 20. The bias RF power source may generate a radio frequency (RF) signal. The bias RF matcher may match impedance of the bias RF signal by controlling bias voltage and bias current applied to the lower electrode 34. The bias RF power source and the source RF power source may be synchronized or desynchronized each other through a synchronizer of a controller.

Thus, the plasma processing apparatus 13 may generate plasma from the process gas using a magnetic field induced by the upper electrode 52 as a coil type antenna.

In example embodiments, the plasma processing apparatus 13 may include a first plasma adjustment assembly 300 configured to change a capacitance in a local region between the upper electrode 52 and the lower electrode 34, and a second plasma adjustment assembly 400 configured to change a capacitance in a local region between a focus ring 36 and the lower electrode 34.

The first plasma adjustment assembly 300 may include a first photoreactive material layer 310 disposed between the upper electrode 52 and the lower electrode 34 and a first light array having a plurality of first light sources 330 configured to irradiate light to a local region of the first photoreactive material layer 310. Additionally, the first plasma adjustment assembly 300 may further include a first light diffusion layer 320 disposed between the first photoreactive material layer 310 and the first light array to diffuse the light from the first light source 330.

The first plasma adjustment assembly 300 may be arranged on the cover 22 as the dielectric window. In particular, the first photoreactive material layer 310 may be disposed on the cover 22 under the upper electrode 52. The first photoreactive material layer 310 may have a circular shape corresponding to a substrate stage 30. The first photoreactive material layer 310 may be arranged between the upper electrode 52 and the cover 22.

A plurality of the first light sources 330 may be arranged on the first photoreactive material layer 310 under the upper electrode 52. A plurality of the first light sources 330 may be arranged in an array shape over the entire surface of the first photoreactive material layer 310. The light diffusion layer 320 may be additionally arranged between the first light array and the first photoreactive material layer 310 to diffuse the light from the first light sources 330.

The second plasma adjustment assembly 400 may include a second photoreactive material layer 410 arranged between the focus ring 36 and the lower electrode 34 and a second light array having a plurality of second light sources 430 configured to irradiate light to a local region of the second photoreactive material layer 410. Additionally, the second plasma adjustment assembly 400 may further include a second light diffusion layer 420 arranged between the second photoreactive material layer 410 and the second light array to diffuse the light from the second light source 430.

The first and second plasma adjustment assemblies may be substantially the same as or similar to the plasma adjustment assembly 100 in FIG. 1 and the plasma adjustment assembly 200 in FIG. 7. Accordingly, a detailed description thereof will be omitted in the interest of brevity.

Hereinafter, a method of processing a substrate using the plasma processing apparatus in FIG. 16 will be explained.

FIG. 17 is a flow chart illustrating a plasma processing method in accordance with example embodiments.

Referring to FIGS. 16 and 17, first, a first plasma adjustment assembly 300 may be arranged between an upper electrode 52 and a lower electrode 34, and a second plasma adjustment assembly 400 may be arranged between a focus ring 36 and the lower electrode 34. In particular, a first photoreactive material layer 310 may be arranged between the upper electrode 52 and the lower electrode 34 and a second photoreactive material layer 410 may be arranged between the focus ring 36 and the lower electrode 34 (S400), and a plurality of first and second light sources 330, 430 configured to irradiate light to a local region of the first and second photoreactive material layers 310, 410 may be arranged (S410).

In example embodiments, the first plasma adjustment assembly 300 may be disposed on a cover 22 as a dielectric window. The first photoreactive material layer 310 may be disposed on the cover 22 under the upper electrode 52, and a plurality of the first light sources 330 may be arranged on the first photoreactive material layer 310 under the upper electrode 52. A first light diffusion layer 320 may be additionally arranged between the first light array and the first photoreactive material layer 310 to diffuse the light from the first light sources 330.

The second plasma adjustment assembly 400 may be disposed in a substrate stage 30. The second photoreactive material layer 410 may be disposed on a support plate 32 under the focus ring 36, and a plurality of the second light sources 430 may be arranged on the second photoreactive material layer 410 under the focus ring 36. A second light diffusion layer 420 may be additionally arranged between the second light array and the second photoreactive material layer 410 to diffuse the light from the second light sources 430.

A plurality of the first and second light sources 330, 430 may be connected to a power control portion (similar to 61 in FIG. 1). The power control portion may be connected to a controller (similar to 63 in FIG. 1) to independently provide power to the first and second light sources 330, 430 under the control of the controller. The amount and wavelength of light of the first and second light sources 330, 430 may be controlled by the power control portion or the controller.

Then, a wafer W may be loaded onto a substrate stage 30 within an inductively coupled plasma (ICP) chamber 20 (S420), and plasma may be generated within the plasma chamber 20 using a magnetic field (S430).

For example, when radio frequency power having a predetermined frequency (for example, 13.56 MHz) is applied to the upper electrode 52, an electromagnetic field induced by the upper electrode 52 may be applied to a source gas injected into the chamber 20 to generate plasma. A bias power having a frequency lower than the frequency of the plasma power may be applied to the lower electrode 34 to attract plasma atoms or ions generated in the chamber 20 toward the lower electrode.

Then, a light amount (or wavelength) of the first and second light sources 330, 430 may be adjusted to locally change capacitances of the first and second photoreactive material layers 310, 410 (S440), and a plasma process may be performed on the wafer W (S450).

For example, the power controller may provide power to only some of the first and second light sources 330, 430 such that light is irradiated to local regions of the first and second photoreactive material layers 310, 410. Accordingly, the capacitances of the local regions of the first and second photoreactive material layers 310, 410 irradiated with the light may be adjusted by the amount or wavelength of the light.

Accordingly, the first and second light sources 330, 430 may be controlled independently, to locally change the capacitance between the upper electrode 52 and the lower electrode 34 and the capacitance between the focus ring 36 and the lower electrode 34. Thus, plasma asymmetry may be improved through the local plasma control of the plasma processing apparatus 13.

The above plasma processing apparatus and method may be used to manufacture semiconductor devices including logic devices and memory devices. For example, the semiconductor device may be applied to logic devices such as central processing units (CPUs), main processing units (MPUs), or application processors (APs), or the like, and volatile memory devices such as DRAM devices, SRAM devices, or non-volatile memory devices such as flash memory devices, PRAM devices, MRAM devices, ReRAM devices, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present disclosure. Accordingly, all such modifications are intended to be included within the scope of example embodiments as defined in the claims.

What is claimed is:

1. A plasma processing apparatus, comprising:
 a chamber providing a space for processing a substrate;
 a substrate stage configured to support the substrate within the chamber, and including a lower electrode;
 an upper electrode facing the lower electrode;
 a focus ring in or on an upper peripheral region of the substrate stage to surround the substrate;
 a first plasma adjustment assembly in a first position between the upper electrode and the lower electrode, the first plasma adjustment assembly including a first photoreactive material layer and a plurality of first light sources configured to irradiate light onto a local region of the first photoreactive material layer, wherein a capacitance of the local region of the first photoreactive material layer is changed as the light is irradiated to the local region of the first photoreactive material layer; and
 a second plasma adjustment assembly in a second position between the focus ring and the lower electrode, the second plasma adjustment assembly including a second photoreactive material layer and a plurality of second light sources configured to irradiate light onto a local region of the second photoreactive material layer, wherein a capacitance of the local region of the second photoreactive material layer is changed as the light is irradiated to the local region of the second photoreactive material layer.

2. The plasma processing apparatus of claim 1, wherein the first plasma adjustment assembly is in a shower head.

3. The plasma processing apparatus of claim 2, wherein the first photoreactive material layer is in a shower head body under the upper electrode, and the plurality of first light sources are between the upper electrode and the first photoreactive material layer.

4. The plasma processing apparatus of claim 2, wherein the upper electrode has a circular shape and the first photoreactive material layer has a circular shape corresponding to that of the upper electrode.

5. The plasma processing apparatus of claim 2, wherein the plurality of first light sources are arranged in an array over an entire surface of the first photoreactive material layer.

6. The plasma processing apparatus of claim 1, wherein the second plasma adjustment assembly is in or on the substrate stage.

7. The plasma processing apparatus of claim 6, wherein the second photoreactive material layer is under the focus ring, and the plurality of second light sources are between the substrate stage and the photoreactive material layer.

8. The plasma processing apparatus of claim 6, wherein the focus ring has an annular shape and the second photoreactive material layer has an annular shape corresponding to that of the focus ring.

9. The plasma processing apparatus of claim 8, wherein the plurality of second light sources extend along a circumference of the annular-shaped second photoreactive material layer, and wherein the plurality of second light sources are spaced apart from each other along the circumference by a predetermined distance.

10. The plasma processing apparatus of claim 1, wherein the first plasma adjustment assembly is on a dielectric window in an upper portion of the chamber.

11. The plasma processing apparatus of claim 10, wherein the upper electrode includes coils, the first photoreactive material layer is on the dielectric window under the upper electrode, and the plurality of first light sources are between the upper electrode and the first photoreactive material layer.

12. The plasma processing apparatus of claim 1, wherein the first plasma adjustment assembly further includes a first light diffusion layer between the first photoreactive material layer and the plurality of first light sources configured to diffuse the light from each light source, and/or
the second plasma adjustment assembly further includes a second light diffusion layer between the second photoreactive material layer and the plurality of second light sources configured to diffuse the light from each light source.

13. The plasma processing apparatus of claim 1, wherein the first photoreactive material layer and the second photoreactive material layer each include a material whose capacitance is changeable according to an amount of light or light wavelength.

14. The plasma processing apparatus of claim 1, wherein the plurality of first light sources and the plurality of second light sources each irradiate light having a wavelength in a range of 330 nm to 850 nm.

15. The plasma processing apparatus of claim 11, wherein the plurality of first light sources are controlled independently to irradiate light to the local region of the first photoreactive material layer, and/or
the plurality of second light sources are controlled independently to irradiate light to the local region of the second photoreactive material layer.

16. A plasma processing apparatus, comprising:
a chamber providing a space for processing a substrate;
a substrate stage configured to support the substrate within the chamber;
an upper electrode facing the substrate stage;
a focus ring in or on an upper peripheral region of the substrate stage to surround the substrate;
a photoreactive material layer between the upper electrode and the substrate stage or between the focus ring and the substrate stage, and including a material whose capacitance is changeable according to an irradiated light;
a plurality of light sources between the upper electrode and the photoreactive material layer or between the substrate stage and the photoreactive material layer, and configured to irradiate light onto the photoreactive material layer; and
a power control portion configured to independently control operations of the plurality of light sources to irradiate the light to a local region of the photoreactive material layer.

17. The plasma processing apparatus of claim 16, wherein the photoreactive material layer is in a shower head body under the upper electrode, and the plurality of light sources are between the upper electrode and the photoreactive material layer.

18. The plasma processing apparatus of claim 17, wherein the upper electrode includes a circular-shaped electrode plate and the photoreactive material layer has a circular shape corresponding to that of the electrode plate of the upper electrode.

19. The plasma processing apparatus of claim 17, wherein the light sources are arranged in an array over an entire surface of the photoreactive material layer.

20. A plasma processing apparatus, comprising:
a chamber providing a space for processing a substrate;
a substrate stage configured to support the substrate within the chamber, and including a lower electrode;
an upper electrode facing the lower electrode;
a focus ring in or on an upper peripheral region of the substrate stage to surround the substrate;
a first plasma adjustment assembly between the upper electrode and the lower electrode, and including a first photoreactive material layer and a plurality of first light sources configured to irradiate light onto a local region of the first photoreactive material layer, wherein a capacitance of the local region of the first photoreactive material layer is changed when the light is irradiated to the local region of the first photoreactive material layer; and
a second plasma adjustment assembly between the focus ring and the lower electrode, and including a second photoreactive material layer and a plurality of second light sources configured to irradiate light onto a local region of the second photoreactive material layer, wherein a capacitance of the local region of the second photoreactive material layer is changed when the light is irradiated to the local region of the second photoreactive material layer.

* * * * *